United States Patent [19]

Saitou et al.

[11] Patent Number: 4,707,676
[45] Date of Patent: Nov. 17, 1987

[54] SUPERCONDUCTING MAGNET

[75] Inventors: Yosio Saitou; Takeshi Kataoka; Moriaki Takechi; Takahiro Matsumoto, all of Ako, Japan

[73] Assignee: Mitsubishi Denki Kabushiki Kaisha, Japan

[21] Appl. No.: 870,376

[22] Filed: Jun. 4, 1986

Related U.S. Application Data

[63] Continuation-in-part of Ser. No. 816,434, Jan. 6, 1986, abandoned.

[30] Foreign Application Priority Data

Jan. 1, 1985 [JP] Japan ................................. 60-242

[51] Int. Cl.$^4$ ............................................. H01F 7/22
[52] U.S. Cl. ................................. 335/216; 174/15 CA
[58] Field of Search ................ 335/211, 214, 216, 301; 174/15 CA, 15 S

[56] References Cited

U.S. PATENT DOCUMENTS

| 4,484,814 | 11/1984 | Kawaguchi et al. | 335/301 |
| 4,490,675 | 12/1984 | Knuettel et al. | 335/301 X |
| 4,587,490 | 5/1986 | Muller et al. | 335/301 X |
| 4,590,428 | 5/1986 | Muller et al. | 335/301 X |

FOREIGN PATENT DOCUMENTS

| 0111218 | 6/1984 | European Pat. Off. | 335/301 |
| 2020666 | 7/1970 | France | 335/301 |

Primary Examiner—George Harris
Attorney, Agent, or Firm—Leydig, Voit & Mayer

[57] ABSTRACT

A superconducting magnet comprising a superconducting coil for generating a magnetic field when current flows therethrough and a vacuum heat insulation vessel storing and maintaining therein the coil at a cryogenic temperature, said vacuum heat insulation vessel having a part, such as a cylindrical outer wall, made of a ferromagnetic material which provides a path of high magnetic permeability for outwardly-directed flux lines of the magnetic field generated by said coil to reduce the spread of the flux lines and weaken the magnetic field outside the vessel.

8 Claims, 6 Drawing Figures

SUPERCONDUCTING MAGNET

This is a Continuation-In-Part of U.S. Ser. No. 816,434, now abandoned filed Jan. 6, 1986, entitled "Superconducting Magnet".

BACKGROUND OF THE INVENTION

This invention relates to a superconducting magnet and, more particularly, to a superconducting coil of a superconducting magnet and its mounting within a vacuum vessel.

FIG. 1 shows a sectional view of a prior art magnet. In FIG. 1, numeral 1 designates a coil which generates a magnetic field 2 when current flows through its winding. In general, a small magnet generates a relatively weak magnetic field and is often used without utilizing a magnetic shield to contain radiation within its environment since the weak magnetic field exerts little influence on the surroundings. FIG. 2 shows a sectional view of another conventional magnet. In FIG. 2, numeral 1 designates a coil by which magnetic fluxes are generated. Numeral 3 designates a magnetic shield which is made of a ferromagnetic substance.

In FIG. 2, since the coil 1 has a large geometry and produces an intense magnetic field 2a within its environment, a magnetic shield 3 made of a ferromagnetic substance is employed for the purpose of preventing influence of the magnetic field on the surroundings (for example, influence on a magnetic disc for a computer installed nearby).

As can be seen in FIG. 1, the magnetic fluxes 2 which extend along the inner periphery of the coil 1 also extend outside the outer periphery of the coil 1 and are represented as loops. Thus, even though the magnetic fluxes 2 generated by the coil 1 are weak, they extend outside the outer periphery of the coil 1 and spread widely. When an intense field is generated, the effect on a magnetic disc device or the like in the immediate surroundings is unavoidable.

Referring to the magnet of FIG. 2, the magnetic fluxes 2a interlinking with the coil are contained by the magnetic shield 3 made of a ferromagnetic substance of high permeability disposed outside the outer periphery of the coil 1. Thus, the magnetic fluxes which pass outside the magnetic shield 3 are weakened. Accordingly, even when equipment liable to be influenced by a magnetic field is installed near the magnet, it is not influenced thereby.

To provide electromagnetic insulation for a superconducting magnet stored in a vessel having vacuum heat insulation, heretofore a magnetic shield of the type described above was disposed around the outer periphery of the vessel. However, with this arrangement, the vessel and shield occupy greater space when the vessel and the geometry of the superconducting magnet enlarge, making the double vessel structure of the magnetic shield and the vacuum heat insulation vessel costly to make.

SUMMARY OF THE INVENTION

The object of this invention is to provide a superconducting magnet and vacuum heat insulating vessel therefor which can be constructed economically and in a small size.

To accomplish the above object, a part of the outer peripheral wall of a vacuum heat insulation vessel having a superconducting coil therein held at a cryogenic temperature is made of ferromagnetic material, for example, iron, thick enough to serve as a magnetic shield.

The vacuum heat insulation vessel is effectively and economically utilized simultaneously to provide heat insulation necessary for optimum reliability and performance of the superconducting coil and magnet inside the vessel and to provide an effective magnetic shield.

DESCRIPTION OF THE PREFERRED EMBODIMENTS

Figure 1:
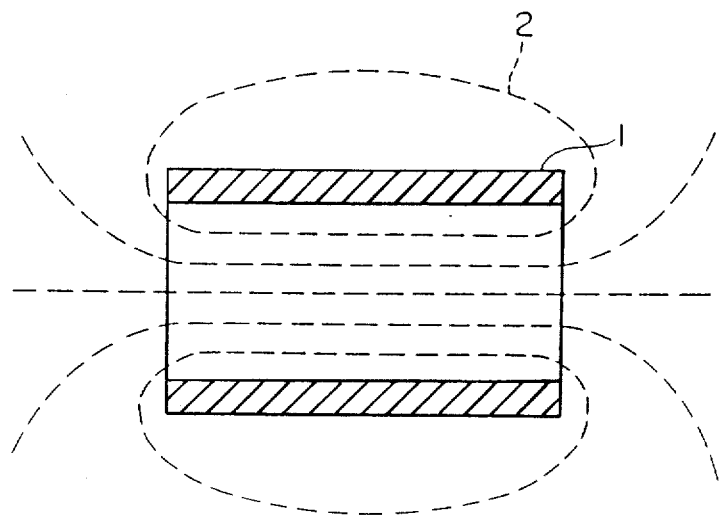
FIG. 1 is a sectional view showing an example of a prior art magnet.
Figure 2:
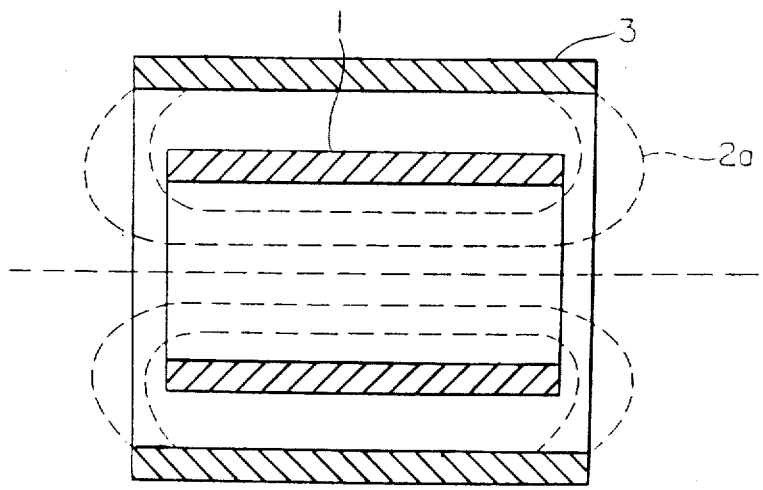
FIG. 2 is a sectional view of another prior art magnet which is furnished with a magnetic shield.
Figure 3:
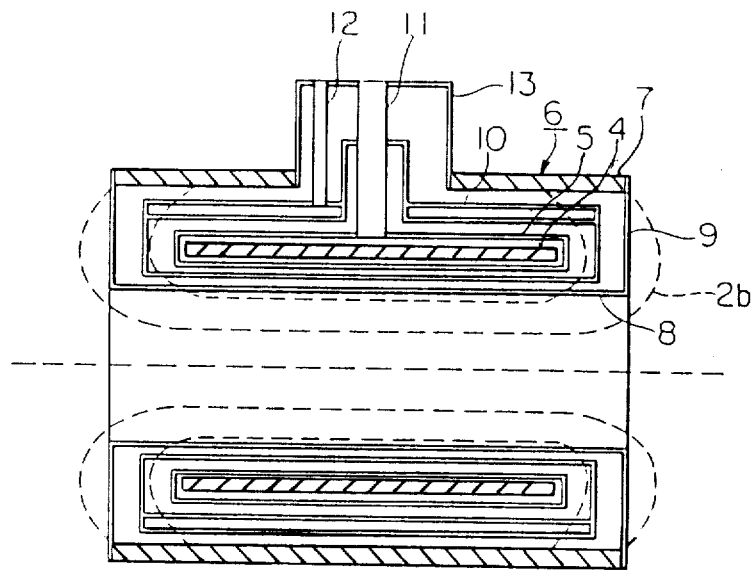
FIG. 3 is a sectional view showing a first embodiment of this invention of a superconducting magnet and magnetic shield within a vessel having vacuum insulation for maintaining cryogenic temperatures within the vessel.

Referring to FIG. 3, a superconducting coil 4 is constructed by winding a superconducting wire. An annular liquid tank 5 receives the superconducting coil 4 and contains a cryogen, such as liquid helium, for cooling the superconducting coil 4. An annular vessel 6 receives the liquid helium tank 5 and has its interior evacuated for heat insulation.

According to this invention, an outer cylinder 7, which lies at the outer peripheral part of the vacuum heat insulation vessel 6, is made of a ferromagnetic material of high permeability having a thickness sufficient to exhibit a magnetic shield effect. An inner cylinder 8 forms the inner periphery of the vacuum heat insulation vessel 6. Flanges 9 correspond to the end parts of the vacuum heat insulation vessel 6. A thermal shield 10 is provided which lies between the liquid helium tank 5 and the outer cylinder 7 and surrounds the liquid helium tank 5. This thermal shield 10 is mounted for the purpose of reducing the quantity of heat entering the liquid helium tank 5, and it is cooled by liquid nitrogen supplied through the inlet tube 12. A communication pipe 11 is provided for filling the liquid helium tank 5 while a communication pipe 12 connects the thermal shield 10 and the exterior of the vessel 6. In order to lengthen the communication pipes and to set sufficient heat insulation distances, a projection 13 is provided.

In the superconducting magnet constructed as shown in FIG. 3, the magnetic fluxes 2b are generated so as to interlink with the superconducting coil 4 when conducting current through this coil. Most of the magnetic fluxes 2b extend along the inner periphery of the superconducting coil 4, and some of them traverse the superconducting coil 4, whereupon they extend along the outer periphery of the superconducting coil 4. Outside the outer periphery of the superconducting coil 4, most of the magnetic fluxes pass through the outer cylinder 7 of the vacuum heat insulation vessel 6 having the function of the magnetic shield, and they return inside the superconducting coil 4. Thus, the magnetic fluxes 2b form loops.

Accordingly, the magnetic fluxes generated by the superconducting coil 4 do not spread much beyond the outer periphery of the outer cylinder 7, whereby the intensity of the magnetic field outside the outer periphery of the superconducting magnet can be suppressed. At the same time, the vacuum heat insulation vessel 6 required in a superconducting magnet is formed.

Figure 4:
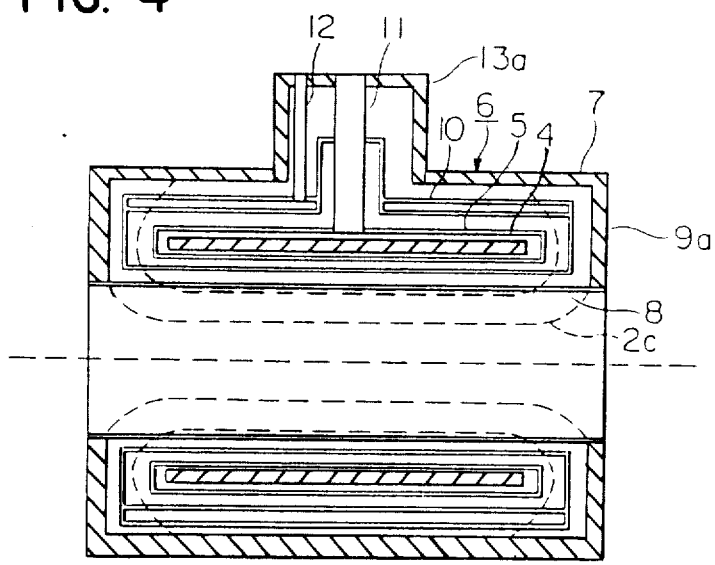
FIG. 4 is a sectional view showing a second embodiment of the present invention.

While the above embodiment has been illustrated as to the case where only the outer cylinder 7 of the vacuum heat insulation vessel 6 is made of the ferromagnetic substance, similar effects are produced when flanges 9a and a projection 13a are also made of the ferromagnetic substance, as shown in FIG. 4. In FIG. 4, magnetic fluxes 2c are generated by the superconducting coil 4. Since the other portions are identical or equivalent to those in FIG. 3, the description thereof will be omitted.

In addition, when the superconducting coil 4 is arranged concentrically with the outer cylinder 7 and flanges 9a of the vacuum heat insulation vessel 6, the magnetic shield is endowed with a symmetry to the magnetic field inside the superconducting coil 4. Accordingly, no influences on the magnetic field inside the superconducting coil 4 occur, and influences thereon are low in case a high degree of uniformity in the magnetic field inside the superconducting coil 4 is required.

Figure 5:
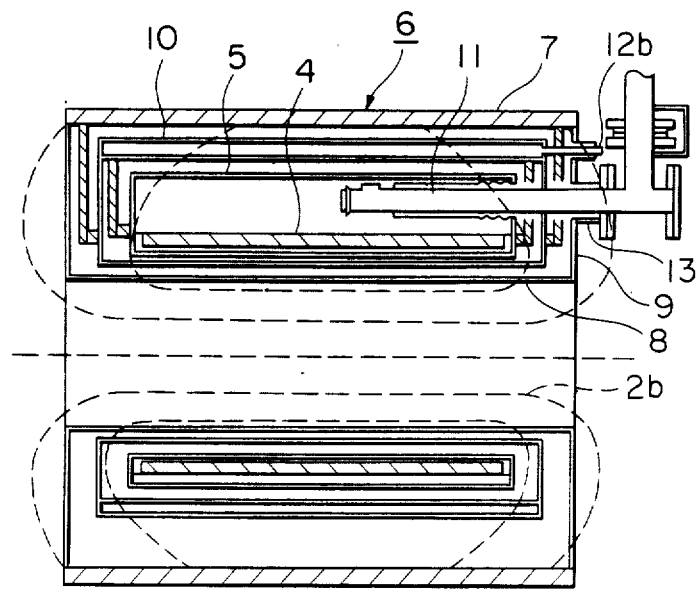
FIG. 5 is a sectional view showing a third embodiment of the present invention.

FIG. 5 shows another embodiment of a superconducting magnet according to the invention in which the communication pipe 11 is penetrated through flange portions 9 and disposed substantially horizontally. In this embodiment, the magnet can be constructed without a perforated through-hole at the outer cylinder 7 so that the pipe can be disposed completely parallel with respect to the axis of a superconducting coil and will provide a minimum disturbance in the symmetry of the field produced by the coil. This is particularly advantageous for a magnet used in an MRI (magnetic resonance imaging) system which needs a uniform magnetic field.

Figure 6:
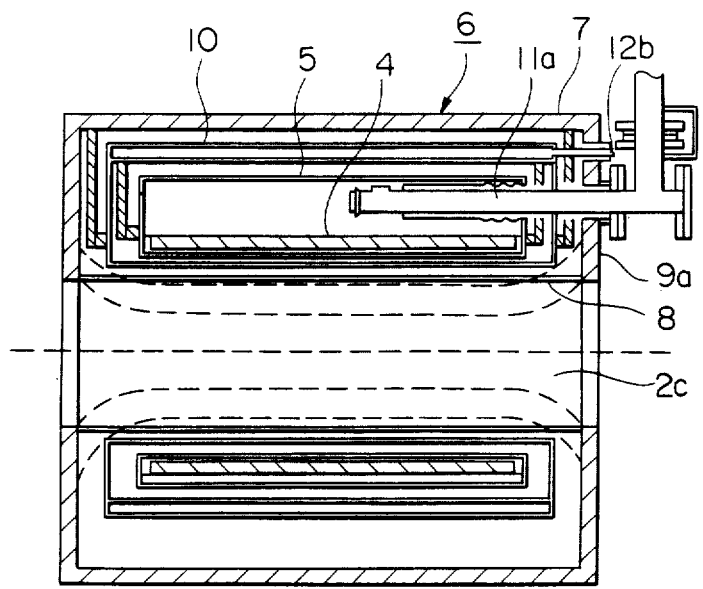
FIG. 6 is a sectional view showing a fourth embodiment of the present invention.

FIG. 6 shows still another embodiment of a superconducting magnet according to the invention in which a communication pipe 11a is disposed substantially horizontally in the same manner as in FIG. 5 but flange portions 9a are formed of ferromagnetic material having sufficient thickness to provide a magnetic shielding effect. Thus, a through-hole for passing flange portions is opened at the portion for penetrating the communication pipe 11a.

In this case, since the outer cylinder 7 and the flanges 9a have a magnetic shielding effect, the magnetic shielding performance is further improved.

As described above, according to the invention the vacuum heat insulation vessel of a superconducting magnet has a part thereof, principally its outer cylinder, made of a ferromagnetic substance having a magnetic shield effect. This alleviates the need to have additional components act as a magnetic shield outside the superconducting magnet and brings forth the effect that the device can be rendered small in size and low in cost.

We claim:

1. A superconducting magnet comprising a superconducting coil generating a magnetic field when current flows threrethrough and a vacuum insulation vessel having an outer wall including end and side sections defining a vacuum space, means within the vacuum space for supporting the superconducting coil, and means within the vacuum space and associated with the coil for containing a cryogenic fluid and for maintaining the coil at a cryogenic temperature, said vessel including:

said outer wall which forms a boundary of the vacuum space having a portion of ferromagnetic material surrounding said coil and providing a path of high magnetic permeability for outwardly-directed flux lines of the magnetic field generated by said coil to reduce the spread of the flux lines and weaken the magnetic field outside the vessel.

2. A superconducting magnet according to claim 1 wherein said portion of said outer wall is in the form of a cylinder around said coil.

3. A superconducting magnet according to claim 1 wherein said portion of said outer wall is cylindrical and said vessel includes two end flange portions of ferromagnetic material joined to said cylinder outer wall portion, said cylindrical wall portion and flange portions providing a path of high magnetic permeability for outwardly-directed flux lines.

4. A superconducting magnet according to claim 2 wherein said coil is cylindrical, said outer cylindrical wall is concentric with said coil and includes a radial protrusion of ferromagnetic material, and said vessel includes a communication pipe disposed substantially parallel to the axis of said cylindrical wall and enters said vessel to the interior thereof extending radially within the protrusion.

5. A superconducting magnet comprising:
a superconducting coil for generating a magnetic field when current is caused to flow therethrough; and
a vacuum heat insulation vessel for storing said coil, said vessel having a vacuum space and means within the vacuum space and associated with the coil for containing a cryogenic fluid and for maintaining said coil at a cryogenic temperature;
said coil having a cylindrical shape and said vacuum heat insulation vessel having an annular construction around said coil with an outer cylindrical wall means of ferromagnetic material which forms a boundary of the vacuum space providing a path of high magnetic permeability for outwardly-directed flux lines of the magnetic field generated by said coil to reduce the spread of the flux lines and weaken the magnetic field outside the vessel.

6. A superconducting magnet comprising a superconducting coil generating a magnetic field when current flows therethrough and a vacuum heat insulation vessel providing a vacuum space for storing and maintaining said coil at a cryogenic temperature, said vessel including:
an outer cylindrical wall having a portion of ferromagnetic material around said coil and providing magnetic shielding;
annular flange portions disposed on opposite ends of said outer cylindrical wall haaving outer circular edges joined to said outer cylindrical wall and inner circular edges;
an inner cylindrical wall concentric with said outer wall and located inside said coil joining the inner circular edges of said end annular flanges, said concentric outer and inner walls and said flanges defining the boundary of the vacuum insulation space for said coil; and
a communication pipe disposed substantially parallel to the axis of said outer and inner walls and penetrating through one of said annular flange portions.

7. A superconducting magnet comprising a superconducting coil generating a magnetic field when current flows therethrough and a vacuum heat insulation vessel providing a vacuum space for storing and maintaining said coil at a cryogenic temperature, said vacuum heat insulation vessel including:
- an outer cylindrical wall and end flanges of ferromagnetic material;
- an inner cylindrical wall concentric with said outer cylindrical wall;
- said superconducting coil being cylindrical in shape and mounted between said concentric outer and inner walls of said vessel;
- said annular flanges providing end walls of said vessel, said concentric outer and inner walls and said end flanges defining the boundary of the vacuum insulation space for said coil; and
- a communication pipe penetrating through one of said walls of said vessel.

8. A superconducting magnet according to claim 7 wherein said annular end flanges are made of ferromagnetic materials providing, together with said outer cylindrical wall portion of ferromagnetic material, a path of high magnetic permeability for outwardly-directed flux lines of the magnetic field generated by said coil to reduce the spread of the flux lines and weaken the magnetic field outside the vessel.

* * * * *

Disclaimer and Dedication

,707,676—*Yosio Saitou; Takeshi Kataoka; Moriaki Takechi, Takahiro Matsumoto*, all of Ako, Japan. SUPERCONDUCTING MAGNET. Patent dated Nov. 17, 1987. Disclaimer and Dedication filed July 25, 1991, by the assignee, Mitsubishi Denki Kabushiki Kaisha.

Hereby disclaims and dedicates to the Public claims 1-3, 5, 7, and 8 of said patent.
[*Official Gazette October 29, 1991*]